(12) United States Patent
Sato et al.

(10) Patent No.: US 10,593,621 B2
(45) Date of Patent: Mar. 17, 2020

(54) SEMICONDUCTOR DEVICE WITH BARRIER LAYER

(71) Applicant: SHINKO ELECTRIC INDUSTRIES CO., LTD., Nagano (JP)

(72) Inventors: Keigo Sato, Nagano (JP); Hiroshi Taneda, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 16/138,252

(22) Filed: Sep. 21, 2018

(65) Prior Publication Data

US 2019/0131236 A1 May 2, 2019

(30) Foreign Application Priority Data

Oct. 27, 2017 (JP) .................. 2017-208586

(51) Int. Cl.
*H01L 23/00* (2006.01)
*H01L 21/768* (2006.01)
(Continued)

(52) U.S. Cl.
CPC ...... *H01L 23/5226* (2013.01); *H01L 21/4867* (2013.01); *H01L 21/76841* (2013.01);
(Continued)

(58) Field of Classification Search
CPC ......... H01L 25/0655; H01L 2224/1329; H01L 2224/9211; H01L 2224/83986; H01L 2224/81203; H01L 2224/81201; H01L 2224/83856; H01L 2224/81193; H01L 2224/73204; H01L 21/4867; H01L 21/76841; H01L 21/563; H01L 24/92; H01L 24/81; H01L 24/73; H01L 24/16;
(Continued)

(56) References Cited

U.S. PATENT DOCUMENTS 7,186,925 B2    3/2007   Tsukahara et al.
2005/0040542 A1* 2/2005  Hashimoto ........... H01L 21/486
                                              257/778
(Continued)

FOREIGN PATENT DOCUMENTS

JP    2004-288959      10/2004
WO    WO 2010/003732  *  1/2010    ............. G01D 5/165

*Primary Examiner* — Galina G Yushina
(74) *Attorney, Agent, or Firm* — IPUSA, PLLC

(57) ABSTRACT

A semiconductor device includes an interconnect substrate, an interconnect trace disposed on an upper surface of the interconnect substrate, a semiconductor chip mounted on the upper surface of the interconnect substrate, an adhesive resin layer disposed between the upper surface of the interconnect substrate and a lower surface of the semiconductor chip to bond the interconnect substrate and the semiconductor chip, the adhesive resin layer including an opening at a bottom of which an upper surface of the interconnect trace is situated, a barrier layer covering a sidewall of the opening, and conductive paste disposed inside the opening, wherein an electrode terminal of the semiconductor chip situated at the lower surface thereof is disposed inside the opening, with the conductive paste filling a space between the barrier layer and the electrode terminal.

8 Claims, 5 Drawing Sheets

(51) Int. Cl.
H01L 23/29 (2006.01)
H01L 23/532 (2006.01)
H01L 25/065 (2006.01)
H01L 23/31 (2006.01)
H01L 21/56 (2006.01)
H01L 23/522 (2006.01)
H01L 21/48 (2006.01)
H01L 23/498 (2006.01)

(52) U.S. Cl.
CPC ...... H01L 23/293 (2013.01); H01L 23/49811 (2013.01); H01L 23/5328 (2013.01); H01L 23/53209 (2013.01); H01L 24/13 (2013.01); H01L 24/16 (2013.01); H01L 24/73 (2013.01); H01L 24/81 (2013.01); H01L 24/83 (2013.01); H01L 24/92 (2013.01); H01L 25/0655 (2013.01); H01L 21/563 (2013.01); H01L 23/3121 (2013.01); H01L 24/29 (2013.01); H01L 24/32 (2013.01); H01L 2224/13014 (2013.01); H01L 2224/1329 (2013.01); H01L 2224/13147 (2013.01); H01L 2224/13294 (2013.01); H01L 2224/13339 (2013.01); H01L 2224/13344 (2013.01); H01L 2224/13347 (2013.01); H01L 2224/13565 (2013.01); H01L 2224/13582 (2013.01); H01L 2224/13647 (2013.01); H01L 2224/13655 (2013.01); H01L 2224/13666 (2013.01); H01L 2224/13671 (2013.01); H01L 2224/13684 (2013.01); H01L 2224/1601 (2013.01); H01L 2224/16227 (2013.01); H01L 2224/2919 (2013.01); H01L 2224/32225 (2013.01); H01L 2224/73104 (2013.01); H01L 2224/73204 (2013.01); H01L 2224/81193 (2013.01); H01L 2224/81201 (2013.01); H01L 2224/81203 (2013.01); H01L 2224/81862 (2013.01); H01L 2224/83192 (2013.01); H01L 2224/83203 (2013.01); H01L 2224/83856 (2013.01); H01L 2224/83862 (2013.01); H01L 2224/83986 (2013.01); H01L 2224/9211 (2013.01); H01L 2924/00015 (2013.01); H01L 2924/15313 (2013.01)

(58) Field of Classification Search
CPC ......... H01L 24/13; H01L 24/83; H01L 24/29; H01L 24/32; H01L 23/5226; H01L 23/49811; H01L 23/53209; H01L 23/5328; H01L 23/293; H01L 23/3121
See application file for complete search history.

(56) References Cited

U.S. PATENT DOCUMENTS

2013/0065345 A1* 3/2013 Huang .............. H01L 31/02242
　　　　　　　　　　　　　　　　　　438/57
2016/0276560 A1* 9/2016 Obata ..................... H01L 33/38

* cited by examiner

SEMICONDUCTOR DEVICE WITH BARRIER LAYER

CROSS-REFERENCE TO RELATED APPLICATIONS

The present application is based upon and claims priority to the prior Japanese Patent Application No. 2017-208586 filed on Oct. 27, 2017, with the Japanese Patent Office, the entire contents of which are incorporated herein by reference.

FIELD

The disclosures herein relate to a semiconductor device and a method of producing a semiconductor device.

BACKGROUND

A semiconductor device having a semiconductor chip mounted on an interconnect substrate is known in the art. The semiconductor chip is bonded to the interconnect substrate via an adhesive resin layer, for example.

In a specific example of this kind of semiconductor device, a semiconductor chip having electrode terminals on one face thereof and an interconnect substrate may be bonded to each other through an adhesive resin layer having openings, and conductive paste disposed in the openings provides connections between the connection terminals of the semiconductor chip and the interconnect layers of the interconnect substrate.

When mounting the semiconductor chip in such a semiconductor device, an adhesive resin layer having openings may be disposed on the interconnect substrate, and conductive paste is poured to fill the openings, followed by pressing the semiconductor chip against the interconnect substrate such as to press the electrode terminals of the semiconductor chip into the conductive paste.

In the case of the above-noted semiconductor device, however, conductive paste may penetrate into the adhesive resin layer through the inner walls of the openings at the time of mounting the semiconductor chip, resulting in the lowering of insulation between the electrode terminals.

RELATED-ART DOCUMENTS

Patent Document

[Patent Document 1] Japanese Laid-open Patent Publication No. 2004-288959

SUMMARY

According to an aspect of the embodiment, a semiconductor device includes an interconnect substrate, an interconnect trace disposed on an upper surface of the interconnect substrate, a semiconductor chip mounted on the upper surface of the interconnect substrate, an adhesive resin layer disposed between the upper surface of the interconnect substrate and a lower surface of the semiconductor chip to bond the interconnect substrate and the semiconductor chip, the adhesive resin layer including an opening at a bottom of which an upper surface of the interconnect trace is situated, a barrier layer covering a sidewall of the opening, and conductive paste disposed inside the opening, wherein an electrode terminal of the semiconductor chip situated at the lower surface thereof is disposed inside the opening, with the conductive paste filling a space between the barrier layer and the electrode terminal.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

[Structure of Semiconductor Device of First Embodiment]

Figure 1A:
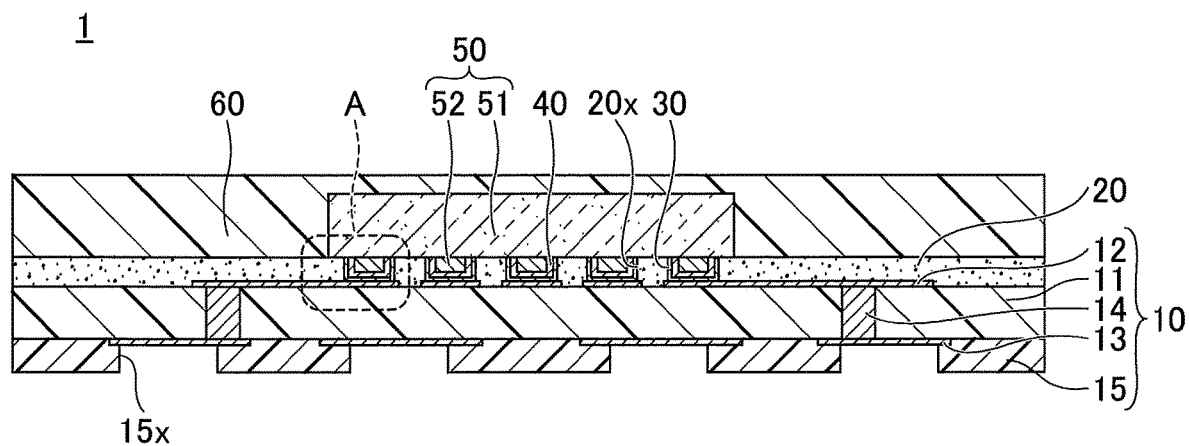
FIGS. 1A and 1B are drawings illustrating an example of a semiconductor device according to a first embodiment.
Figure 1B:
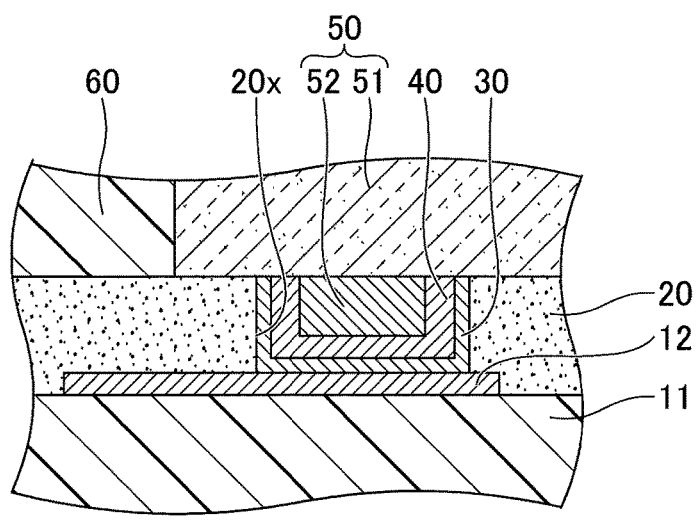

In the following, a description will be first given of the structure of a semiconductor device of a first embodiment. FIGS. 1A and 1B are cross-sectional views illustrating an example of a semiconductor device according to the first embodiment. FIG. 1A illustrates the whole view, and FIG. 1B illustrates an enlarged view of an area A illustrated in FIG. 1A.

In FIG. 1A, a semiconductor device 1 of the first embodiment includes an interconnect substrate 10, an adhesive resin layer 20, a barrier layer 30, conductive paste 40, a semiconductor chip 50, and an encapsulation resin layer 60. The interconnect substrate 10 includes an insulating layer 11, an interconnect trace 12, an interconnect trace 13, a via 14, and a solder resist layer 15.

In the present embodiment, for the sake of convenience, the semiconductor-chip-50 side of the semiconductor device 1 is referred to as an upper side or a first side, and the solder-resist-layer-15 side of the semiconductor device 1 is referred to as a lower side or a second side. A surface (or face) of a given member that faces toward the upper side is referred to as a first surface (or first face) or an upper surface (or upper face), and a surface (or face) of the given member that faces toward the lower side is referred to as a second surface (or second face) or a lower surface (or lower face). It may be noted, however, that the semiconductor device 1 may be used in an upside-down position, or may be placed at any angle. Further, a plan view refers to a view taken in the direction perpendicular to the first surface of the insulating layer 11, and a planar shape refers to the shape of an object as viewed in the direction perpendicular to the first surface of the insulating layer 11.

The insulating layer 11 of the interconnect substrate 10 may be made of a flexible insulating material such as a polyimide-based resin, a polyamide-based resin, or a liquid crystal polymer, for example. The insulating layer 11 may be made of a rigid material such as a glass epoxy substrate made by impregnating a glass cloth with thermosetting insulating resin such as epoxy-based resin, for example. The insulating layer 11 may be made of a rigid material such as a substrate made by impregnating a woven cloth or non-woven cloth of glass fiber, carbon fiber, aramid fiber, or the like with thermosetting insulating resin such as epoxy-based resin or a polyimide-based resin. The insulating layer 11 may include filler such as silica ($SiO_2$). The thickness of the insulating layer 11 may be about 50 to 500 micrometers, for example.

The interconnect trace 12 is disposed on the upper surface (i.e., first surface) of the insulating layer 11. The interconnect trace 13 is disposed on the lower surface (i.e., second surface) of the insulating layer 11. The interconnect trace 12 and the interconnect trace 13 are electrically coupled to each other through the via 14 penetrating through the insulating layer 11. The plan view shape of the via 14 may be circular, for example.

Copper (Cu) or the like may be used as the material of the interconnect traces 12 and 13. The thickness of each of the interconnect traces 12 and 13 may approximately be 2 to 30 micrometers, for example. Copper (Cu) may be used as the material of the via 14. The interconnect trace 12 and the via 14 or the interconnect trace 13 and the via 14 may be made as one seamless piece.

The solder resist layer 15 is formed on the lower surface of the insulating layer 11 to at least partially cover the interconnect trace 13. The solder resist layer 15 has openings 15x. The lower faces of the interconnect traces 13 are partially exposed at the deepest end of the openings 15x. The interconnect traces 13 exposed at the deepest end of the openings 15x serve as pads for electrical connection with another interconnect substrate, a semiconductor package, a semiconductor chip, or the like. The material of the solder resist layer 15 may be a photosensitive insulating epoxy-based resin, a photosensitive insulating acrylic resin, or the like. The thickness of the solder resist layer 15 may be about 10 to 30 micrometers, for example.

The semiconductor chip 50 includes a main body 51 made of silicon or the like and electrode terminals 52 projecting from the main body 51. The electrode terminals 52 may be metal posts such as copper posts, which may be a cylindrical shape, for example. The electrode terminals 52 are disposed on the active surface of the semiconductor chip 50. The length of the electrode terminals 52 protruding from the active surface may be 10 to 30 micrometers, for example. The semiconductor chip 50 is flip-chip-mounted on the interconnect substrate 10 such that the active surface having the electrode terminals 52 faces the interconnect traces 12.

The adhesive resin layer 20 for bonding the interconnect substrate 10 to the semiconductor chip 50 is disposed between the opposing surfaces of the interconnect substrate 10 and the semiconductor chip 50. The adhesive resin layer 20 may be disposed over the entirety of the upper surface of the interconnect substrate 10, or may be disposed at least to fill the gap between the opposing surfaces of the interconnect substrate 10 and the semiconductor chip 50. The material of the adhesive resin layer 20 may be selected by taking into account factors such as adhesion to the insulating layer 11 and to the semiconductor chip 50 as well as a difference in thermal expansion coefficients with respect to the insulating layer 11 and the semiconductor chip 50. An epoxy-based resin, a polyimide-based resin, or the like may be used as the material. The thickness of the adhesive resin layer 20 may be about 20 to 40 micrometers, for example.

The adhesive resin layer 20 has the openings 20x through which the upper faces of the interconnect traces 12 are selectively exposed. In the case of the electrode terminals 52 being cylindrical projections, for example, the openings 20x may be cylindrical holes having a larger diameter than the electrode terminals 52. For example, the diameter of the electrode terminals 52 may be 90 micrometers, and the diameter of the openings 20x may be 100 micrometers.

The barrier layer 30 continuously covers the sidewall of the opening 20x of interest and the portion of the upper face of the interconnect trace 12 situated directly below this opening 20x. The barrier layer 30 may be made of a metal material, having a higher hardness than metal powder (which will be described later) dispersed in the conductive paste 40, such as titanium copper alloy (TiCu), chromium (Cr), NiCu/Cu, tungsten (W), copper (Cu), or the like. NiCu/Cu is a multilayered film in which a copper layer is laminated on a nickel copper alloy layer. The use of a multilayered film for the barrier layer 30 is preferable from the perspective of providing a more robust barrier layer 30. The thickness of the barrier layer 30 may be about 30 to 100 nanometers, for example.

Each electrode terminal 52 of the semiconductor chip 50 is situated inside the respective opening 20x, with the thermosetting conductive paste 40 filling the space enclosed by the bottom and side surfaces of the electrode terminal 52, the active surface of the semiconductor chip 50, and the barrier layer 30 that is formed on the sidewall of the opening 20x and on the upper face of the interconnect trace 12 exposed inside the opening 20x. The electrode terminals 52 of the semiconductor chip 50 are electrically coupled to the interconnect traces 12 through the barrier layers 30 and the conductive paste 40.

Copper paste may preferably be used as the conductive paste 40. Conductive paste other than copper paste such as silver paste or gold paste may alternatively be used. The term "conductive paste" refers to a paste comprised of conducive filler and binder. To be more specific, metal powder to serve as conductive filler is dispersed inside a binder resin. Copper, silver, gold, or the like may preferably be used as the metal powder. Metal powder of an alloy of two or more metals or a mixture of two or more types of metal powders may alternatively be used. Epoxy-based resin, polyimide-based resin, or the like, for example, may be used as the binder material. Even after the curing of the conductive paste, the conductive filler stays in the original shape and dispersed in the binder. The conductive paste does not contain either solder or solder paste whose particles would melt into a single consolidated piece after the curing treatment.

The encapsulation resin layer 60 is disposed on the adhesive resin layer 20 such as to cover the semiconductor chip 50. In order to improve heat dissipation, the upper face of the semiconductor chip 50 may alternatively be exposed through the encapsulation resin layer 60. The encapsulation resin layer 60 may be made of mold resin or the like that is an epoxy-based resin inclusive of fillers, for example.

[Method of Making Semiconductor Device of First Embodiment]

In the following, a description will be given of a method of making a semiconductor device according to the first embodiment. FIGS. 2A through 2E and FIGS. 3A through 3D are drawings illustrating examples of steps for making the semiconductor device according to the first embodiment. The interconnect substrate 10 is manufactured such that the substrate includes a plurality of areas each used for creating a device similar to the semiconductor device 1. Semiconductor chips 50 are mounted on the interconnect substrate 10, which is eventually divided into pieces each serving as the semiconductor device 1. In the following, only one area corresponding to one piece is illustrated for the sake of convenience.

Figure 2A:
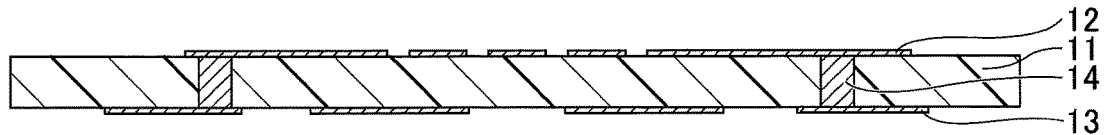
FIGS. 2A through 2E are drawings illustrating an example of a process of making the semiconductor device according to the first embodiment.

In the process step illustrated in FIG. 2A, the insulating layer 11 is provided. The material and thickness of the insulating layer 11 are the same as those previously described. A laser machining process is employed to form holes penetrating through the insulating layer 11, followed by using a dispenser or the like to fill the holes with conductive paste, and then curing the paste to form the vias 14. Copper paste, gold paste, silver paste, or the like, for example, may be used as the conductive paste. The vias 14 may be formed by plating.

The interconnect traces 12 and the interconnect traces 13 are formed on the upper surface and lower surface, respectively, of the insulating layer 11. The interconnect traces 12 are electrically coupled to the interconnect traces 13 through the vias 14. The interconnect traces 12 and 13 may be formed by use of a semi-additive method, for example. The material and thickness of the interconnect traces 12 and 13 are the same as those previously described.

Figure 2B:
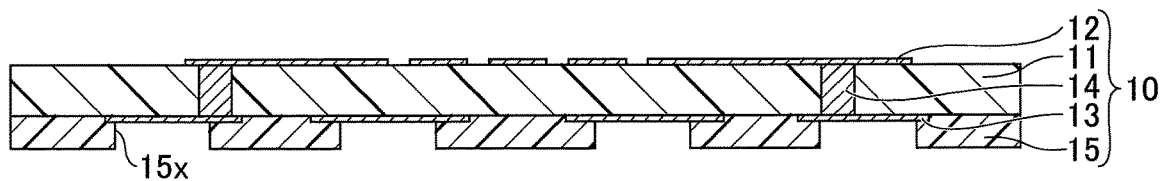

In the process step illustrated in FIG. 2B, the solder resist layer 15 covering the interconnect traces 13 is formed on the lower surface of the insulating layer 11. The solder resist layer 15 may be formed by screen printing, roll coating, spin coating, or the like which applies a photosensitive insulating epoxy-based resin, a photosensitive insulating acrylic resin, or the like in liquid form or paste form, for example, onto the lower surface of the insulating layer 11 such as to cover the interconnect traces 13. Alternatively, a film made of a photosensitive insulating epoxy-based resin, a photosensitive insulating acrylic resin, or the like may be laminated onto the lower surface of the insulating layer 11 such as to cover the interconnect traces 13.

The applied or laminated insulating resin is then exposed to light and developed to form the openings 15x (i.e., by use of photolithography). In this manner, the solder resist layer 15 having the openings 15x is formed, with the openings 15x exposing part of the lower surfaces of the interconnect traces 13. Alternatively, a film made of an insulating resin having the openings 15x formed in advance may be laminated onto the lower surface of the insulating layer 11 such as to cover the interconnect traces 13.

Figure 2C:
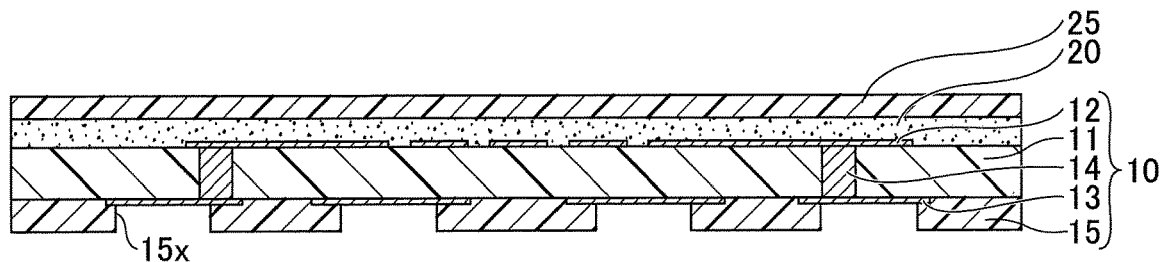

In the process step illustrated in FIG. 2C, the adhesive resin layer 20 covering the interconnect traces 12 is formed on the upper surface of the insulating layer 11. Specifically, the adhesive resin layer 20 in the B-stage state (i.e., semi-cured state) is laminated onto the upper surface of the insulating layer 11 such as to cover the interconnect traces 12, for example. Alternatively, the adhesive resin layer 20 in paste form is applied to the upper surface of the insulating layer 11 such as to cover the interconnect traces 12. The material and thickness of the adhesive resin layer 20 are the same as those previously described.

After the formation of the adhesive resin layer 20, a protective film 25 for protecting the adhesive resin layer 20 is disposed on the upper surface of the adhesive resin layer 20. The protective film 25 may be implemented as a polyimide film or polyethylene terephthalate film having a thickness of a few tens of micrometers, for example. The adhesive resin layer 20 is not cured in this process step, and will stay in the B-stage state (i.e., semi-cured state) through a few subsequent process steps.

Figure 2D:
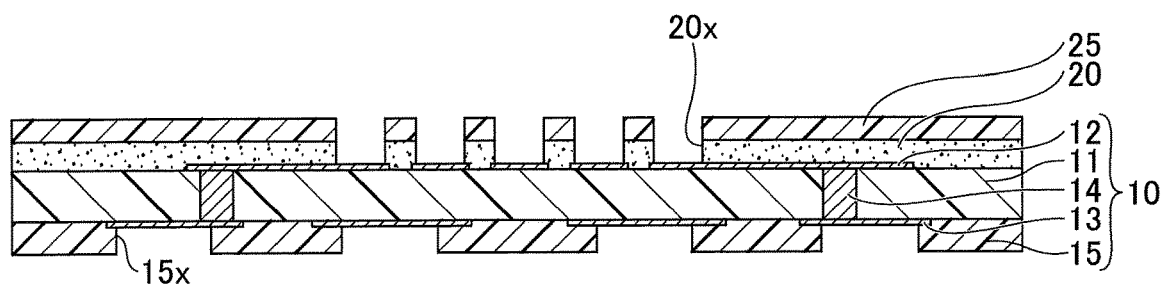

In the process step illustrated in FIG. 2D, the openings 20x are formed such as to penetrate the adhesive resin layer 20 and the protective film 25 and to expose the upper surfaces of the interconnect traces 12. The openings 20x may be formed by laser machining, for example. In this case, a YAG laser or an excimer laser may be used, for example.

Figure 2E:
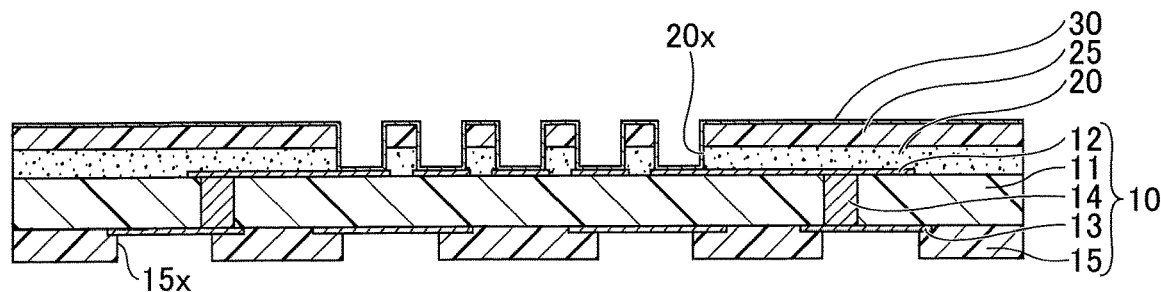

In the process step illustrated in FIG. 2E, the barrier layer 30 is formed by spattering or the like such that the barrier layer 30 continuously covers the upper surface of the protective film 25, the sidewalls of the openings 20x, and the upper surfaces of the interconnect traces 12 exposed inside the openings 20x. The material and thickness of the barrier layer 30 are the same as those previously described.

Figure 3A:
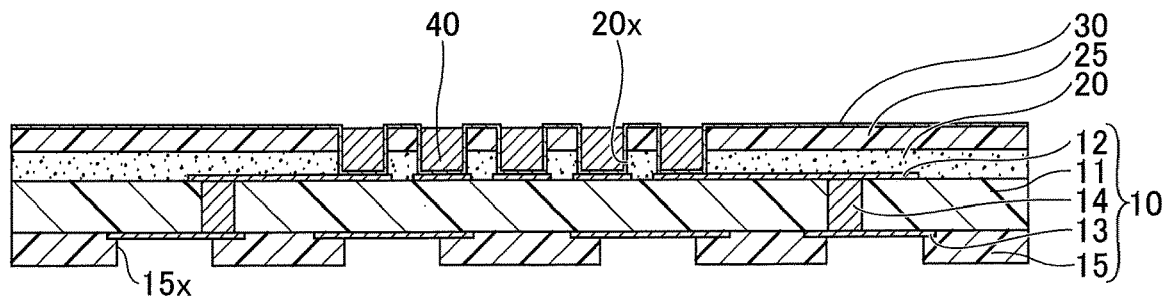
FIGS. 3A through 3D are drawings illustrating an example of the process of making the semiconductor device according to the first embodiment.
Figure 3B:
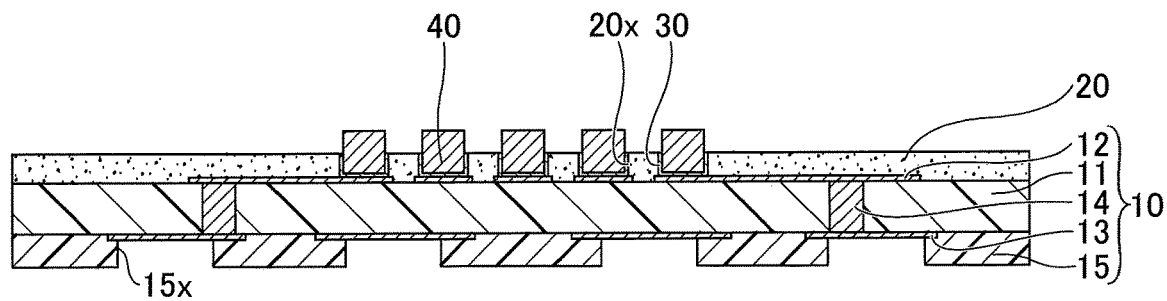

In the process step illustrated in FIG. 3A, a dispenser or the like is used to fill the openings 20x having the barrier layer 30 formed therein with the conductive paste 40. The conductive paste 40 is in contact with the barrier layer 30 only, and is not in contact with the interconnect traces 12, the adhesive resin layer 20, or the protective film 25.

Figure 4A:
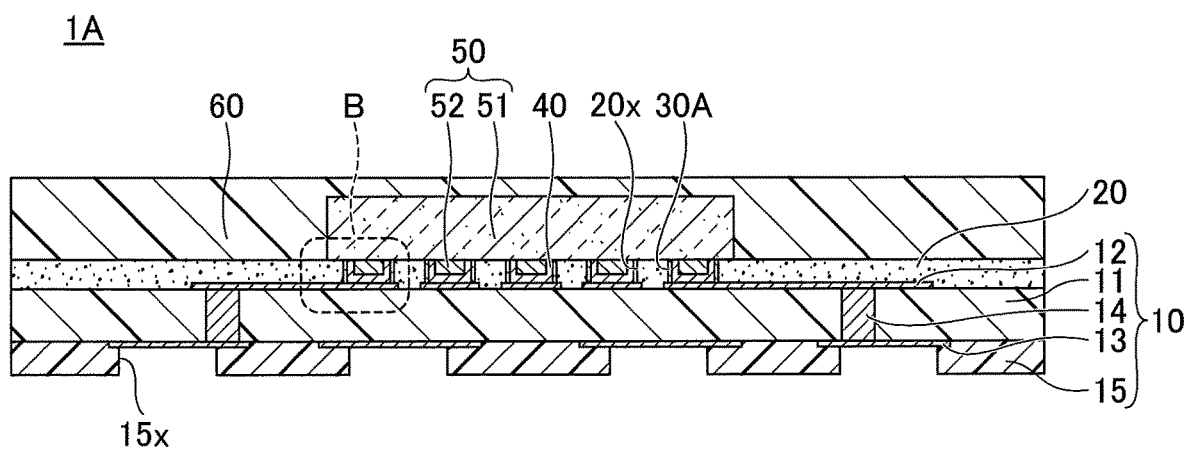
FIGS. 4A and 4B are drawings illustrating an example of a semiconductor device according to a second embodiment.
Figure 4B:
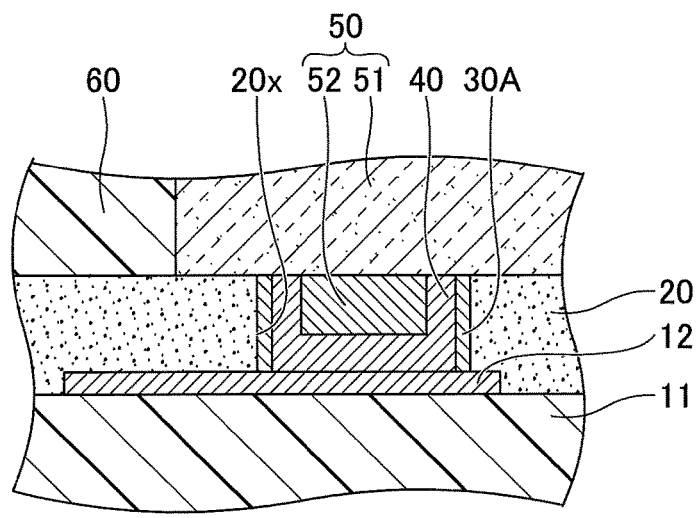

In the process step illustrated in FIG. 4B, the protective film 25 is removed (i.e., separated). In conjunction with the removal of the protective film 25, the barrier layer 30 placed in contact with the protective film 25 is also removed. The removal of the protective film 25 causes part of the conductive paste 40 to project from the upper surface of the adhesive resin layer 20. The removal of the protective film 25 also causes the edge faces of the barrier layer 30 to be exposed at the upper surface of the adhesive resin layer 20.

Figure 3C:
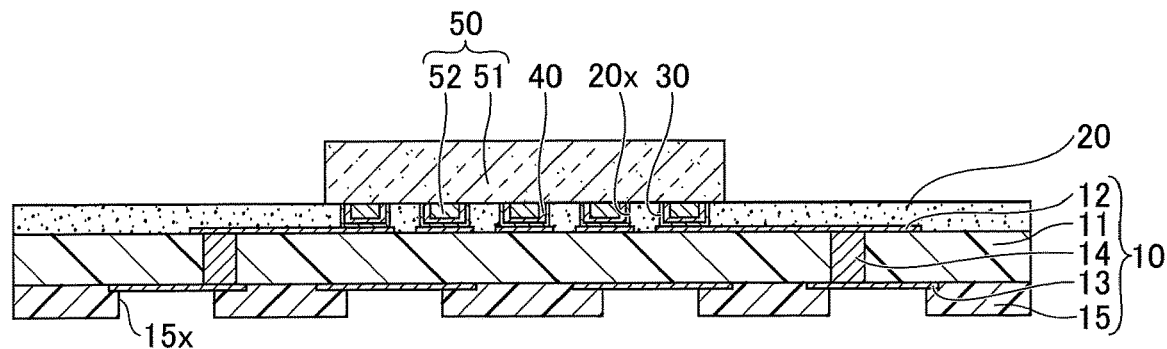

In the process step illustrated in FIG. 3C, the semiconductor chip 50 is mounted on the interconnect substrate 10, with the electrode terminals 52 facing toward the interconnect substrate 10. Specifically, the semiconductor chip 50 having the electrode terminals 52 is placed over the interconnect substrate 10 such that the electrode terminals 52 are in contact with the conductive paste 40. The semiconductor chip 50 is then pressed toward the interconnect substrate 10 such that the electrode terminals 52 enter the openings 20x, resulting in the conductive paste 40 filling the gap between the barrier layer 30 and the electrode terminals 52. Consequently, the conductive paste 40 is enclosed in the space surrounded by the barrier layer 30, the electrode terminals 52, and the active surface of the semiconductor chip 50. Further, the active surface of the semiconductor chip 50 is placed in contact with the upper surface of the adhesive resin layer 20 situated around the barrier layers 30.

The conductive paste 40 has low density, and is compressed only in the thickness direction. Because of this, pressing the semiconductor chip 50 toward the interconnect substrate 10 does not cause the conductive paste 40 to spill onto the upper surface of the adhesive resin layer 20 situated around the barrier layers 30.

The adhesive resin layer 20 and the conductive paste 40 are then cured while the semiconductor chip 50 is being pressed against the interconnect substrate 10, thereby bonding the opposing faces of the interconnect substrate 10 and the semiconductor chip 50 together through the adhesive resin layer 20. The electrode terminals 52 of the semiconductor chip 50 are electrically coupled to the interconnect traces 12 through the barrier layers 30 and the conductive paste 40.

The temperature for curing the adhesive resin layer 20 and the conductive paste 40 may approximately 180 degrees Celsius, for example. This temperature is lower than the melting point (e.g., 220 degrees Celsius) of solder that would be used if solder was used in place of the conductive paste 40, so that the warpage of the interconnect substrate 10 is comparatively reduced.

Figure 3D:
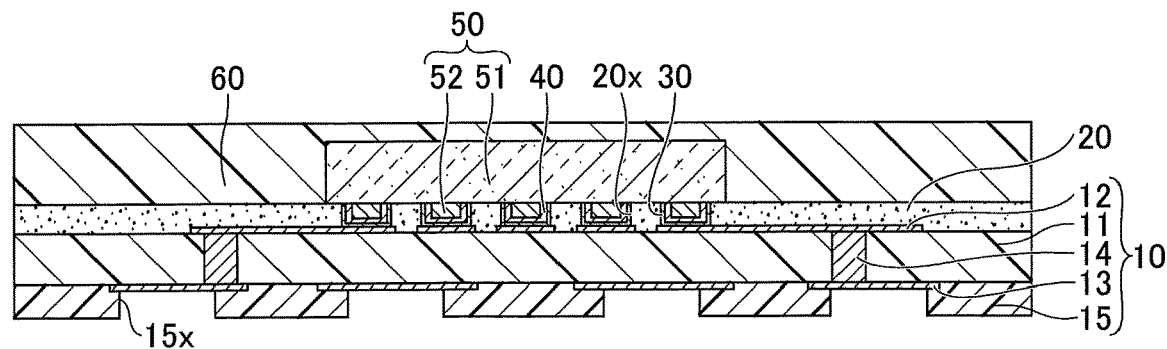

In the process step illustrated in FIG. 3D, the encapsulation resin layer 60 covering the semiconductor chip 50 is formed on the adhesive resin layer 20. In order to improve heat dissipation, the upper face of the semiconductor chip 50 may alternatively be exposed through the encapsulation resin layer 60. The encapsulation resin layer 60 may be made of mold resin or the like that is an epoxy-based resin inclusive of fillers, for example. The encapsulation resin layer 60 may be formed by use of a transfer mold method or a compression mold method. After the process step illustrated in FIG. 3D, the interconnect substrate 10 is divided into a plurality of pieces each serving as the semiconductor device 1, thereby producing the semiconductor devices 1 as illustrated in FIG. 1.

As described above, the openings 20x are formed through the adhesive resin layer 20 that is inserted between the interconnect substrate 10 and the semiconductor chip 50 to bond the interconnect substrate 10 and the semiconductor chip 50. The barrier layer 30 is formed on the sidewalls of the openings 20x and the upper faces of the interconnect traces 12 exposed through the openings 20x. With this arrangement, the conductive paste 40 is situated in the space surrounded by the barrier layer 30 without penetrating into the adhesive resin layer 20, so that insulation between the adjacent electrode terminals 52 is improved.

Because of the presence of the interconnect traces 12 at the bottom of the openings 20x, the conductive paste 40 would not penetrate into the adhesive resin layer 20 at the bottom of the openings 20x even if the barrier layer 30 was not formed on the interconnect traces 12. Accordingly, the portions of the barrier layer 30 covering the upper surfaces of the interconnect traces 12 may be removed by laser machining, for example. In this case, the barrier layer 30 made of metal is formed only on the sidewalls of the openings 20x.

Second Embodiment

The second embodiment is directed to a configuration in which the barrier layer is formed of a different material from that of the first embodiment. In connection with the second embodiment, a description of the same or similar constituent elements as those of the previously provided descriptions may be omitted as appropriate.

FIGS. 4A and 4B are cross-sectional views illustrating an example of a semiconductor device according to the second embodiment. FIG. 4A illustrates the whole view, and FIG. 4B illustrates an enlarged view of an area B illustrated in FIG. 4A.

By referring to FIGS. 4A and 4B, a semiconductor device 1A of the second embodiment differs from that of the first embodiment in that a barrier layer 30A replaces the barrier layer 30.

The barrier layer 30A is formed to cover the sidewalls of the openings 20x, but is not formed on the upper surfaces of the interconnect traces 12 exposed in the openings 20x. The barrier layer 30A may be made of an inorganic material having higher hardness than metal powder dispersed in the conductive paste 40. Such material may be an oxide or the like such as alumina, zinc oxide, or lanthanum oxide. The thickness of the barrier layer 30A may be about 30 to 100 nanometers, for example.

Each electrode terminal 52 of the semiconductor chip 50 is situated inside the respective opening 20x, with the thermosetting conductive paste 40 filling the space enclosed by the barrier layer 30A formed on the sidewall of the opening 20x, the upper surface of the interconnect trace 12 exposed in the opening 20x, the bottom and side surfaces of the electrode terminal 52, and the active surface of the semiconductor chip 50. The electrode terminals 52 of the semiconductor chip 50 are electrically coupled to the interconnect traces 12 through the conductive paste 40.

In order to make the semiconductor device 1A, the same or similar process steps as those illustrated in FIGS. 2A through 2E of the first embodiment are first performed. It may be noted, however, that in the process step illustrated in FIG. 2E, the barrier layer 30A made of an inorganic material is continuously formed on the upper surface of the protective film 25, the sidewalls of the openings 20x, and the upper surfaces of the interconnect traces 12 exposed in the openings 20x by ALD (i.e., atomic layer deposition) or the like. The material and thickness of the barrier layer 30A are the same as those previously described.

Figure 5A:
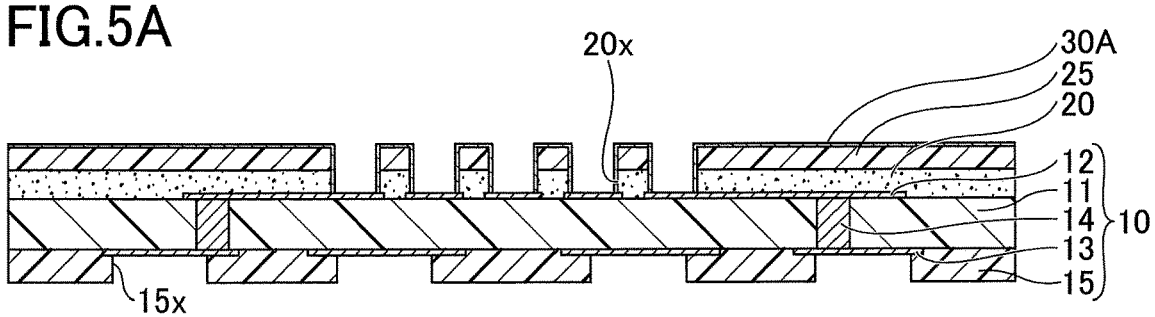
FIGS. 5A through 5E are drawings illustrating an example of a process of making the semiconductor device according to the second embodiment.

In the subsequent process step illustrated in FIG. 5A, the portion of the barrier layer 30A covering the upper surfaces of the interconnect traces 12 are removed by laser machining, for example. In this case, a YAG laser or an excimer laser may be used, for example.

Figure 5B:
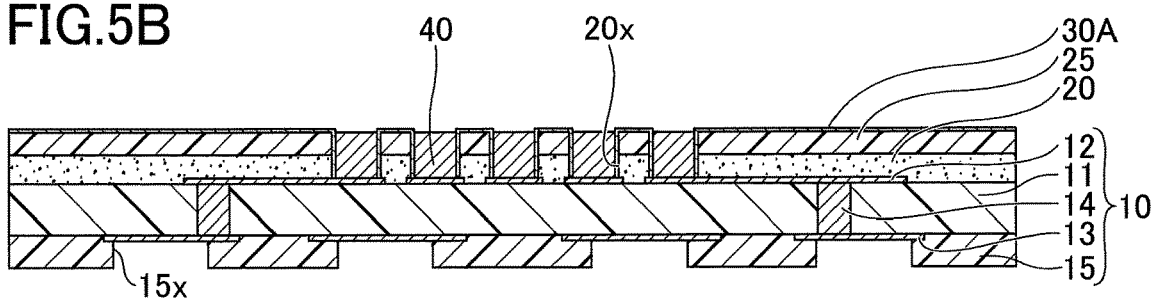
Figure 5C:
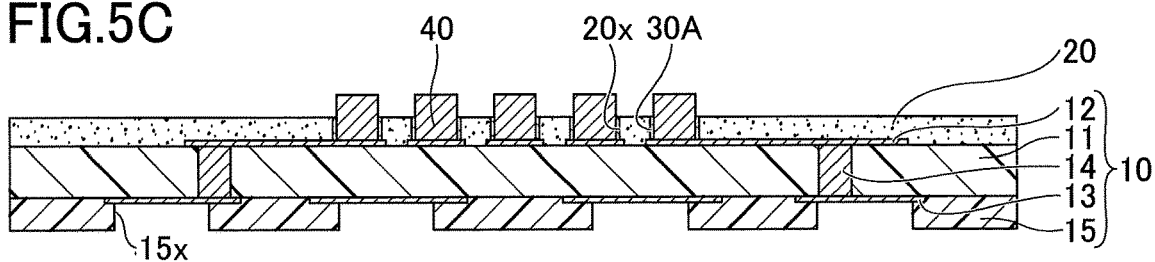

In the process step illustrated in FIG. 5B, a dispenser or the like is used to fill the openings 20x with the conductive paste 40. It may be noted that the conductive paste 40 is in contact with the barrier layer 30A covering the sidewalls of the openings 20x and the interconnect traces 12 exposed at the bottom of the openings 20x, and is not in contact with either the adhesive resin layer 20 or the protective film 25.

In the process step illustrated in FIG. 5O, the protective film 25 is removed. In conjunction with the removal of the protective film 25, the barrier layer 30A placed in contact with the protective film 25 is also removed. The removal of the protective film 25 causes part of the conductive paste 40 to project from the upper surface of the adhesive resin layer 20. The removal of the protective film 25 also causes the edge faces of the barrier layer 30A to be exposed at the upper surface of the adhesive resin layer 20.

Figure 5D:
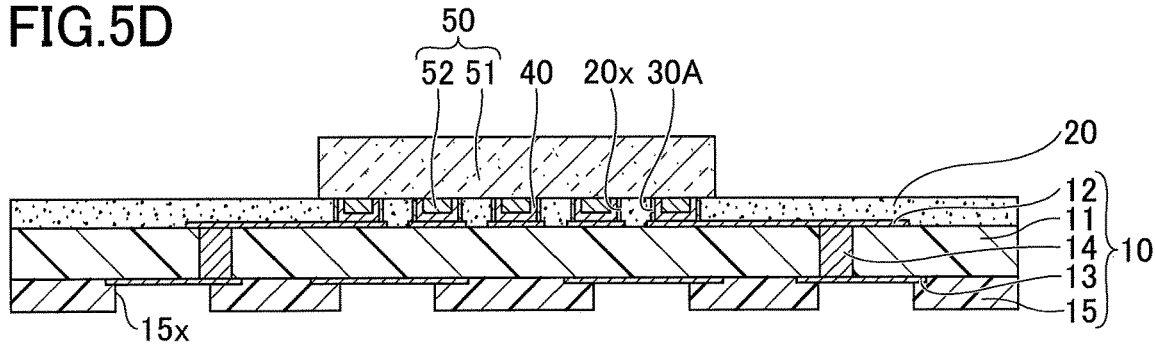
Figure 5E:
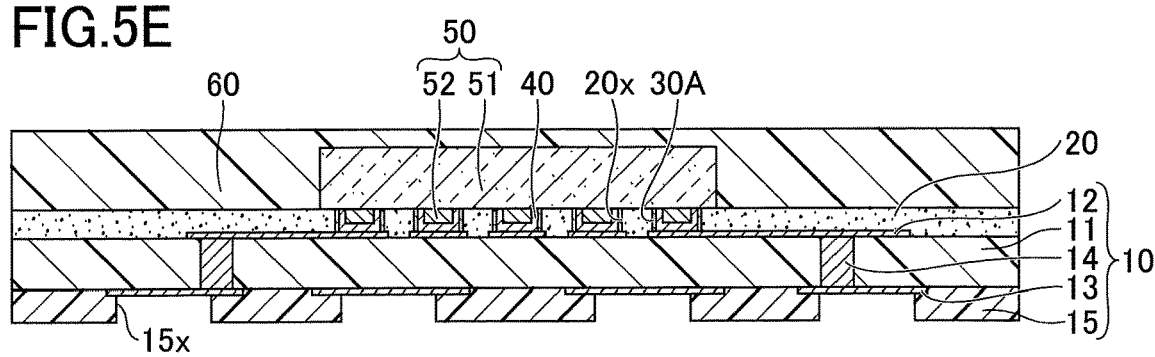

In the process steps illustrated in FIG. 5D and FIG. 5E, the same or similar steps as those of FIG. 3C and FIG. 3D are performed to complete the semiconductor device 1 in final form as illustrated in FIG. 4.

In the semiconductor device 1A described above, the openings 20x are formed through the adhesive resin layer 20 that is inserted between the interconnect substrate 10 and the semiconductor chip 50 to bond the interconnect substrate 10 and the semiconductor chip 50. The barrier layer 30A is formed on the sidewalls of the openings 20x. With this arrangement, the conductive paste 40 is situated in the space surrounded by the barrier layer 30A without penetrating into the adhesive resin layer 20, so that insulation between the adjacent electrode terminals 52 is improved.

The ALD method used to form the barrier layer 30A is preferable because the method requires no mask when forming a film and also because the method offers satisfactory controllability of film thickness. Further, the ALD method is capable of forming a film over a wider area at once than the sputtering method, thereby serving to shorten the manufacturing time. Namely, the use of the ALD method enables the formation of a film on a larger number of areas in one step when the film is formed on the substrate having a plurality of areas each serving as the semiconductor device 1A, thereby making it possible to shorten the manufacturing time.

Although a description has been given with respect to preferred embodiments and the like, the present invention is not limited to these embodiments and the like, but various variations and modifications may be made to these embodiments and the like without departing from the scope of the present invention.

For example, the semiconductor device of the disclosed embodiments is directed to an example in which a semiconductor chip is mounted on an interconnect substrate having two interconnect layers (i.e., two layers of interconnect traces). This is not a limiting example. Namely, a semiconductor chip may be mounted on an interconnect substrate having three or more interconnect layers (i.e., three or more layers of interconnect traces). The method of making an interconnect substrate on which a semiconductor chip is mounted is not limited to a particular method. A semiconductor chip may be mounted on an interconnect substrate made by the buildup method, for example, or may be mounted on an interconnect substrate made by any other method. The interconnect substrate made by the buildup method may have a core layer, or may be a coreless substrate.

According to at least one embodiment, a semiconductor device with improved insulation between electrode terminals is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

In addition to the subject matter recited in the claims, the present disclosures include aspects of the subject matter as set out non-exhaustively in the following numbered clauses:

[Clause 1] A method of making a semiconductor device, comprising:
disposing an adhesive resin layer in a semi-cured state on an interconnect substrate having an interconnect trace on an upper surface thereof;
forming an opening through the adhesive resin layer to expose an upper surface of the interconnect trace at a position corresponding to a position of an electrode terminal of a semiconductor chip to be mounted;
forming a barrier layer continuously covering both a sidewall of the opening and the upper surface of the interconnect trace situated at a bottom of the opening;
filling the opening having the barrier layer with conductive paste;
placing the semiconductor chip over the interconnect substrate such that the electrode terminal of the semiconductor chip is in contact with the conductive paste;
pressing the semiconductor chip toward the interconnect substrate such that the conductive paste fills a space between the barrier layer and the electrode terminal; and
curing the adhesive resin layer and the conductive paste to bond opposing surfaces of the interconnect substrate and the semiconductor chip through the adhesive resin layer.

[Clause 2] The method as recited in clause 1, further comprising removing, after forming the barrier layer, that portion of the barrier layer which covers the upper surface of the interconnect trace.

[Clause 3] The method as recited in clause 1, further comprising disposing a protective film on the adhesive resin layer before forming the opening,
wherein the process of forming the opening forms the opening that penetrates through the protective film and the adhesive resin layer to expose the upper surface of the interconnect trace,
wherein the process of forming the barrier layer forms the barrier layer that continuously covers an upper surface of the protective film, the sidewall of the opening, and the upper surface of the interconnect trace situated at the bottom of the opening, and
wherein the protective film and the barrier layer placed in contact with the protective film are removed after the process of filling the opening.

[Clause 4] The method as recited in clause 1, wherein the barrier layer is made of a metal material.

[Clause 5] The method as recited in clause 2, wherein the barrier layer is made of an inorganic material.

What is claimed is:

1. A semiconductor device, comprising:
an interconnect substrate having an interconnect trace disposed on an upper surface thereof;
a semiconductor chip mounted on the upper surface of the interconnect substrate;
an adhesive resin layer disposed between the upper surface of the interconnect substrate and a lower surface of the semiconductor chip to bond the interconnect substrate and the semiconductor chip, the adhesive resin layer including an opening at a bottom of which an upper surface of the interconnect trace is situated;
a barrier layer covering a sidewall of the opening; and
a conductive paste disposed inside the opening,
wherein an electrode terminal of the semiconductor chip situated at the lower surface thereof is disposed inside the opening, with the conductive paste filling a space between the barrier layer and the electrode terminal, and
wherein the barrier layer is disposed both on the sidewall of the opening and on a bottom face of the opening, the sidewall being the adhesive resin layer, the bottom face being the interconnect trace.

2. The semiconductor device as claimed in claim 1, wherein the barrier layer is made of a metal material.

3. The semiconductor device as claimed in claim 1, wherein the barrier layer is made of an inorganic material.

4. The semiconductor device as claimed in claim 1, wherein the conductive paste includes a binder resin and metal powder dispersed in the binder resin.

5. The semiconductor device as claimed in claim 4, wherein the barrier layer is made of a material having a higher hardness than the metal powder included in the conductive paste.

6. The semiconductor device as claimed in claim 1, wherein the barrier layer has a thickness of 30 nanometers to 100 nanometers.

7. The semiconductor device as claimed in claim 1, wherein the electrode terminal is electrically coupled to the interconnect trace through the conductive paste.

8. The semiconductor device as claimed in claim 1, wherein the conductive paste is in direct contact with the interconnect trace.

* * * * *